United States Patent [19]

Western

[11] 4,370,701
[45] Jan. 25, 1983

[54] ENERGY CONSERVING DRIVE CIRCUIT FOR SWITCHED MODE CONVERTER UTILIZING CURRENT SNUBBER APPARATUS

[75] Inventor: Ralph E. Western, Cedar Rapids, Iowa

[73] Assignee: Rockwell International Corporation, El Segundo, Calif.

[21] Appl. No.: 257,287

[22] Filed: Apr. 24, 1981

[51] Int. Cl.³ .......................................... H02M 3/335
[52] U.S. Cl. ....................................... 363/20; 363/49; 363/56; 323/901
[58] Field of Search .................................. 363/18–21, 363/49, 56, 97; 323/901

[56] References Cited

U.S. PATENT DOCUMENTS

| | | | |
|---|---|---|---|
| 4,031,453 | 6/1977 | Teuling | 363/20 |
| 4,093,877 | 6/1978 | Pollmeier | 323/289 X |
| 4,156,273 | 5/1979 | Sato | 323/901 X |
| 4,246,634 | 1/1981 | Purol | 323/901 X |
| 4,261,032 | 4/1981 | Cavigelli | 363/97 X |
| 4,268,898 | 5/1981 | Brown | 363/56 X |

FOREIGN PATENT DOCUMENTS

| | | | |
|---|---|---|---|
| 55-29286 | 3/1980 | Japan | 363/56 |
| 694956 | 10/1979 | U.S.S.R. | 363/49 |

OTHER PUBLICATIONS

Whitcomb, et al., "Designing Non-Dissipative Current Snubbers for Switched Mode Converters", *Proceedings of the Sixth National Solid-State Power Conversion Conference*, May, 1979.

William J. Shaughnessy, "Modelling and Design of Non-Dissipative LC Snubber Networks", *Proceedings of the Seventh National Solid-State Power Conversion Conference*, Mar. 1980.

Robert J. Boschert, "Flyback Converters: Solid-State Solution to Low-Cost Switching Power Supplies", *Electronics*, Dec. 21, 1978, pp. 100–104, Fig. 3.

Toshio Fujimura et al., "Wide-Range and High Efficiency Switching Power Supply for Color TV Receivers", *IEEE Transactions on Consumer Electronics*, vol. CE-24, No. 3, Aug. 1978, pp. 473–479.

Primary Examiner—William M. Shoop
Assistant Examiner—Peter S. Wong
Attorney, Agent, or Firm—Michael E. Taken; Bruce C. Lutz; Howard R. Greenberg

[57] ABSTRACT

An energy conserving drive circuit is provided for switched mode power converters having a transformer with primary current controlled by a main power switch whose conduction is in turn controlled by a pulse width modulator. Transformer leakage inductance energy is applied to drive the pulse width modulator and the main power switch in a run mode after start-up. The drive circuit includes an improved non-dissipative snubber network which supplies the drive power for the main power switch and which also disables a start-up circuit.

3 Claims, 1 Drawing Figure

ENERGY CONSERVING DRIVE CIRCUIT FOR SWITCHED MODE CONVERTER UTILIZING CURRENT SNUBBER APPARATUS

TECHNICAL FIELD

The invention relates to switched mode power converters having a transformer with primary current controlled by a main power switch such as a transistor whose conduction is in turn controlled by pulse width modulator means. The invention more particularly relates to an energy conserving drive circuit for the pulse width modulator and the main power switch.

BACKGROUND

Power supplies with switched mode converters for transforming an input voltage to one or more different output voltages are known in the art. Primary current through a transformer from an input source voltage is controlled by a main power switch such as a high speed, high voltage, power switching transistor. The transistor is switched on and off to provide a changing rate of current through the transformer primary, i.e., cause an alternately collapsing field to couple and induce the flux into the transformer secondary and thus yield a given output voltage.

One of the problems encountered with switched mode converters is the need to protect the power switching transistor from reverse bias secondary breakdown, and thermal runaway. This problem is solved by using a turn-off current snubber to shape the load line.

One type of such snubber is an RC dissipative current snubber comprising a resistor, a diode and a capacitor. The disadvantage of the RC snubber is the excessive power dissipation within the resistor of the RC network. In the RC snubber, the energy stored on the capacitor during and following transistor turn-off must ultimately be dissipated within the network resistor. The wattage dissipated within the resistor will often exceed that dissipated in the switching transistor. Not only is efficiency reduced, but often an additional heat dissipator must be incorporated into the design to prevent overheating the neighboring components as well as the resistors themselves. For further background regarding RC dissipative current snubbers, reference is made to the background review sections of Whitcomb, et al., "Designing Non-Dissipative Current Snubbers For Switched Mode Converters", *Proceedings of the Sixth National Solid-State Power Conversion Conference*, May, 1979, and William J. Shaughnessy, "Modelling and Design of Non-Dissipative LC Snubber Networks", *Proceedings of the Seventh National Solid-State Power Conversion Conference*, March, 1980.

In order to improve system efficiency and avoid the wasteful RC dissipative current snubber, LC non-dissipative current snubbers have been developed, for example as shown in the above noted Whitcomb and Shaughnessy references. The LC snubber adds negligible power dissipation to the converter circuit thus easing the problem of heat dissipation and improving efficiency. The energy stored in the capacitor of the LC snubber is returned to the input source voltage line.

Another technique for conserving transformer leakage inductance energy is shown in Robert J. Boschert, "Flyback Converters: Solid-State Solution to Low-Cost Switching Power Supplies", *Electronics*, Dec. 21, 1978, pp. 100-104, FIG. 3. This design uses an RC snubber but also includes an auxiliary clamp winding having the same number of turns as the primary and connected back to the input source voltage through a rectifier diode. The diode clamps the leakage inductance spike on the primary switch to the input source voltage.

Another technique for conserving transformer leakage inductance energy is described in Toshio Fujimura et al., "Wide-Range and High Efficiency Switching Power Supply for Color TV Receivers", *IEEE Transactions on Consumer Electronics*, Vol. CE-24, No. 3, August, 1978 pp. 473-479. This technique uses interleaved transformer windings to reduce leakage inductance. This increases the cost of the transformer, and also makes it more difficult to insulate the primary from the secondary.

In addition to the above described need to improve overall system efficiency by conserving transformer leakage inductance energy, there is also a need for improved energy efficiency in the driving circuit for the pulse width modulator and the high voltage transistor. There is a need to provide power to the pulse width modulator and the transistor switch with minimum loss over a wide input voltage and frequency range.

The present invention affords a common solution to both of the above noted needs.

SUMMARY

The invention provides an improved energy conserving switched mode power converter of the type having a transformer with primary current controlled by a main power switch such as a transistor whose conduction is in turn controlled by pulse width modulator means such as an oscillator. A non-dissipative snubber network applies transformer leakage inductance energy to drive the pulse width modulator means and the main power switch.

The invention further relates to improvements in non-dissipative snubber circuitry. A first capacitor is charged by transformer leakage inductance energy upon each turn-off of the main power switch. A second larger capacitor is charged in increments through the first capacitor until a given threshold charge level is reached in the second capacitor after a plurality of ON-OFF cycles of the main power switch. The pulse width modulator and the main power switch are driven by the stored energy in the second capacitor, which capacitor is recharged during OFF cycles of the main power switch. An inductor is provided in a loop with the first capacitor and the main power switch for limiting discharge of the first capacitor through the main power switch when the latter is ON.

The invention relates to further improvements in the drive circuitry for the pulse width modulator and power switch by incorporating an energy conserving start-up combination. Transformer leakage inductance energy is used to cut out or disconnect the start-up circuit, to reduce energy waste. Input source voltage supplied to the transformer is also supplied through a start-up circuit to drive the pulse width modulator and the main power switch. The snubber circuit applies transformer leakage inductance energy to the start-up circuit to disable the latter.

The invention affords a switched mode converter circuit which is self-driven in an operating mode from the power that would otherwise be wasted in a dissipative snubber circuit or merely coupled back into the inut source voltage line.

DETAILED DESCRIPTION

Figure 1:
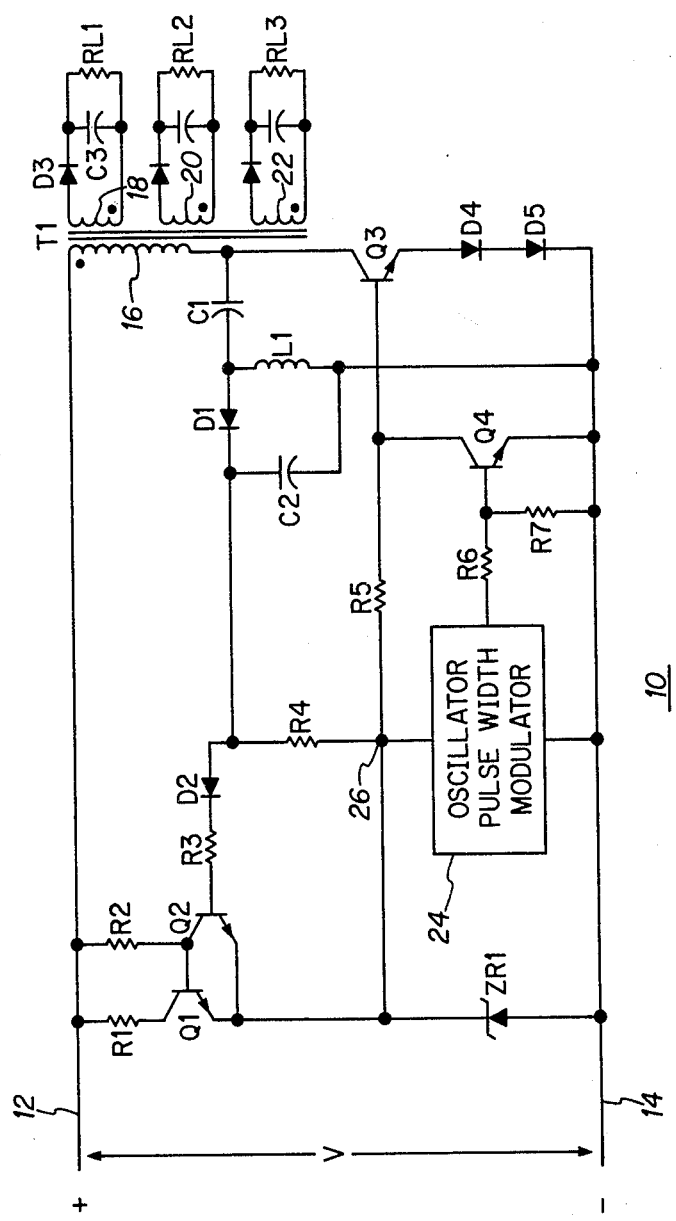
FIG. 1 is a circuit diagram of a switched mode converter circuit combination constructed in accordance with the invention.

The circuit combination in FIG. 1 is a switched mode power converter, generally designated 10, for converting an input source voltage V from a rectifier or the like applied across input terminals or lines 12 and 14 into one or more given output voltages, for example across load representative resistors RL1, RL2, and RL3. The circuit includes a transformer T1, and a main power switch, such as a power transistor Q3, for controlling primary current through T1. When Q3 is conducting, current flows from input source voltage line 12 through the primary of T1 and through Q3 to line 14. This charging of T1 builds up a magnetic flux in the primary 16. When Q3 turns off, the field collapses and the changing rate of current and changing rate of magnetic flux induces current on the secondaries 18, 20 and 22.

As indicated by the polarity dots, when the top end of primary 16 is positive, which occurs when Q3 is ON, the bottom end of secondary 18 is positive. When the bottom end of primary 16 is positive, which occurs when Q3 is OFF, the top end of secondary 18 is positive. This latter condition causes current to flow through diode D3 to load RL1. This current also charges capacitor C3 which reduces ripple on the alternate polarity across secondary 18, i.e., C3 stores enough charging current when Q3 is OFF to support load current through RL1 and keep the voltage within tolerances when Q3 is ON, as is known in the art.

In applications of converter 10, the input voltage ranged from 100 to 300 volts. In one exemplary application, a 120 volt AC source was supplied through a diode bridge type rectifier having a capacitor across its ouratio of primary 16 to secondary 22 was 10:1, to thus transform the 120 volt input to a 12 volt output across load RL3. Secondary 20 was comparable. The turns ratio between primary 16 and secondary 18 was 24:1, to thus transform the 120 volt input to a 5 volt output across RL1.

As is well known in the art, as the turns ratio increases, it becomes more difficult to obtain good coupling between the primary and the secondary of a transformer. Not all of the flux circulating in the primary winding gets coupled into the secondary winding. The larger the turns ratio, the greater the uncoupled flux. It is these uncoupled flux lines that cause spike currents to occur upon turn-off of Q3, commonly called transformer leakage inductance.

If there were ideal coupling between the transformer primary and secondary, there would be no current spike on the collector of Q3 at turn-off because all the voltage would appear across secondaries 18, 20 and 22. Since transformer coupling is not ideal in practical applications, it is necessary to dissipate or otherwise divert the transformer leakage inductance energy away from the collector of Q3 to protect the transistor at turn-off.

As above noted, various types of current snubber circuits provide an alternate discharge path from the bottom end of primary 16 to divert the leakage inductance energy away from the collector of Q3 and thus protect the latter against the avalanche and secondary breakdown failures and thermal runaway at turn-off. As above noted, the snubber circuits include an RC dissipation type which dissipates the energy in a resistor, and an LC dissipationless type which may return such energy back to input source voltage line 12.

In the preferred embodiment of the present invention, transformer leakage inductance energy from the bottom end of primary 16 is directed to an improved LC driving circuit and applied through resistor R4 to pulse width modulator 24 and main power switch Q3, as will now be described in conjunction with various other improvements.

Conduction of Q3 is controlled by a pulse width modulator or oscillator 24, such as a 555 one-shot multivibrator, or a TL 494, or a SG1524. Pulse width modulator 24 base-drives transistor Q4 into conduction, which in turn removes or diverts base-drive from Q3, to render the latter non-conductive. When Q4 is OFF, Q3 is base-driven into conduction. Pulse width modulator 24 thus controls the ON and OFF time of main power switch Q3. Resistor R6 limits base-drive to Q4, and resistor R7 causes faster turn-off of Q4 when the current in R6 goes to zero. R7 also affords a base-emitter leakage path for high temperature operation. As is well known, the relative timing or cycling of pulse width modulator 24 may be controlled by feedback from the loads, such as RL1, RL2 and RL3 (not shown for the sake of clarity).

A start-up circuit is provided by transistors Q1 and Q2. Current from input source voltage line 12 flows through resistor R1 and transistor Q1 which is base driven into conduction by the bias afforded across resistor R2 connected to line 12. The current through transistor Q1 drives pulse width modulator 24 from point 26 and also flows through resistor R5 to supply the base drive to transistor Q3. With Q3 gated ON, primary current flows through transformer T1 until pulse width modulator 24 drives transistor Q4 into conduction which diverts the drive current through R5 away from the base of Q3, rendering the latter non-conductive. This in turn causes a reversal of polarity across the primary 16 of T1 such that the bottom of primary 16 is positive with respect to the top of primary 16.

The transformer leakage inductance energy charges a small capacitor C1, i.e., C1 provides an alternate path for the leakage inductance energy from the transformer in order to protect Q3 at turn-off. A second larger capacitor C2 is charged in increments through C1 until a given threshhold charge level is reached in C2 after a plurality of ON-OFF cycles of Q3. In one application, C1 had a value of 0.0047 microfarads, and C2 had a value of 1 microfarad. C2 gets a small increment of voltage change or charge on it while C1 gets charged up to the full input voltage thereacross. Voltages in the range from 300 to 400 volts typically appear at the collector of Q3 when it turns off. Most of this voltage appears across C1 as it charges and only a small increment thereof charges through diode D1 to C2. During the next cycle (the next OFF time of Q3), another small increment of charge is deposited on C2, and so on for perhaps a couple hundred switch intervals (ON-OFF cycles of Q3), since C1 is about 200 times less than C2, until the charge on C2 reaches said given threshold.

In one application, the given threshold for C2 is about 8 volts. This level is sufficient to provide enough base drive through diode D2 and 1 Kohm resistor R3 to bias Q2 into conduction. When Q2 turns ON, it diverts base-drive away from Q1 to render the latter non-conductive. This disables the starting circuit and disconnects current flow from line 12 to point 26 through Q1. Current flow from line 12 through resistor R2 is minimal because of the high value of the latter, e.g., R2 has a value of 220K and R1 has a value of 5.6K. The trickle of current through R2 is sufficient to bias Q1 into conduction when Q2 is OFF, but is insufficient to drive Q3 when Q2 is ON.

The energy stored in C2 drives the pulse width modulator 24 and transistor Q3. When C2 reaches about 6.8 volts, current begins to flow down through resistor R4, e.g., 47 ohms, to point 26 and provide the necessary drive for pulse width modulator 24 and transistor Q3. When C2 reaches 8 volts, Q2 turns ON and the starter circuit is disabled, whereafter pulse width modulator 24 and main power switch Q3 are operated entirely from the energy stored in capacitor C2, which in turn is the transformer leakage inductance energy. C2 continues to be charged with a small increment each time Q3 is OFF, so that the energy level in C2 is replenished or recharged during each switching cycle. Zener diode ZR1, e.g., 6.8 v, is provided across pulse width modulator 24 to limit the maximum voltage applied thereto in the event that the charge being transferred through R4 becomes excessive or more than what is needed to drive modulator 24. Diode D1 is poled in series-aiding direction from C1 to C2 to permit charging of C2 through C1 but to prevent discharge of C2 through C1.

An inductor L1, e.g., 4.7MHy, is provided in a loop with capacitor C1 and transistor Q3 for limiting discharge of C1 through Q3 when the latter is ON. When Q3 turns ON, there is a need to limit the rate of discharge of C1 therethrough in order to protect Q3. Otherwise, excessive current flow might damage Q3. Even though Q3 is a power switch, it has very low resistance when fully turned ON and it is desired not to permit any further substantial current flow therethrough in addition to that normally flowing through the primary 16 of T1 and Q3. L1 slows down the discharge rate of C1. Diodes D3 and D4 provide a slight negative bias on the emitter of Q3 to facilitate faster turn-off of the latter.

It is recognized that various modifications are possible within the scope of the appended claims. For example, even though the preferred embodiment of the energy conserving drive circuit of the invention is disclosed in the application of a fly-back converter, the invention of course may be implemented in a broad variety of power converter circuit architectures.

I claim:

1. A switched mode power converter comprising, in combination:
   transformer means;
   main power switch means, connected to said transformer means, for controlling conduction of primary current therethrough in accordance with an input control signal supplied thereto; and
   non-dissipative snubber means, connected to said transformer means and said main power switch means, for converting transformer leakage inductance energy to drive said main power switch, said non-dissipative snubber means comprising,
   a first capacitor C1 charged by said transformer leakage inductance energy upon each turn-OFF of said main power switch;
   a second layer capacitor C2 charged in increments through C1 until a given threshold charge level is reached in C2 after a plurality of ON-OFF cycles of said main power switch;
   an inductor connected to said C1 and C2 capacitors for limiting discharge of C1 through said main power switch means when the latter is in an ON condition; and
   a diode connected between C1 and C2 and poled in series-aiding direction from C1 to C2 to permit charging of C2 through C1 but to prevent discharge of C2 through C1 whereby the snubber means acts as a step-down voltage device to supply useful low voltages to said switch means in a non-dissipative fashion.

2. Apparatus as claimed in claim 1 comprising, in addition, a pulse-width modulator connected to supply control signals to drive said main power switch means and connected to said snubber means for receiving non-dissipative, stepped-down supply voltages therefrom.

3. The invention according to claim 2 comprising, in addition, a start-up circuit connected in circuit with an input source voltage of the transformer to initially drive the pulse-width modulator and the main power switch and which is disabled by said non-dissipative snubber means when the stepped-down output voltage therefrom reaches a predetermined value.

* * * * *